United States Patent [19]

Matsuda et al.

[11] Patent Number: 4,589,005
[45] Date of Patent: May 13, 1986

[54] CHARGE TRANSFER DEVICE HAVING IMPROVED ELECTRODES

[75] Inventors: Hajime Matsuda; Hiroshi Morito, both of Tokyo, Japan

[73] Assignee: NEC Corporation, Tokyo, Japan

[21] Appl. No.: 500,595

[22] Filed: Jun. 2, 1983

[30] Foreign Application Priority Data

Jun. 2, 1982 [JP] Japan ................... 57-95506

[51] Int. Cl.$^4$ ............... H01L 29/78; G11C 19/28
[52] U.S. Cl. .......................... 357/24; 377/61
[58] Field of Search ............ 357/24; 377/57–63

[56] References Cited

U.S. PATENT DOCUMENTS

| | | | |
|---|---|---|---|
| Re. 30,917 | 4/1982 | Hagiwara et al. ................... | 357/24 |
| 3,919,564 | 11/1975 | Walden ................................. | 357/24 |
| 3,921,194 | 11/1975 | Engeler et al. ..................... | 357/24 |
| 3,921,195 | 11/1975 | Smith et al. ........................ | 357/24 |
| 4,179,793 | 12/1979 | Hagiwara ............................ | 357/24 |
| 4,242,692 | 12/1980 | Hagiwara ............................ | 357/24 |
| 4,381,516 | 4/1983 | Kadota ................................. | 357/24 |
| 4,403,237 | 9/1983 | Ohkubo et al. ..................... | 357/24 |

OTHER PUBLICATIONS

Sequin et al, *Charge Transfer Devices*, Academic Press, N.Y., 1975, pp. 24–29.

*Primary Examiner*—Gene M. Munson
*Attorney, Agent, or Firm*—Sughrue, Mion, Zinn, Macpeak & Seas

[57] ABSTRACT

A charge transfer device in which a number of transfer electrodes, comprised of alternating main electrodes and auxiliary electrodes, are formed on but insulated from a channel region in a semiconductor substrate for transferring charges. The transfer electrodes are formed such that the sides of each of the electrodes which are transverse to the channel direction are concave in the direction of charge transfer. These concave sides produce an additional accelerating electric field which supplements the conventional fringing fields.

6 Claims, 8 Drawing Figures

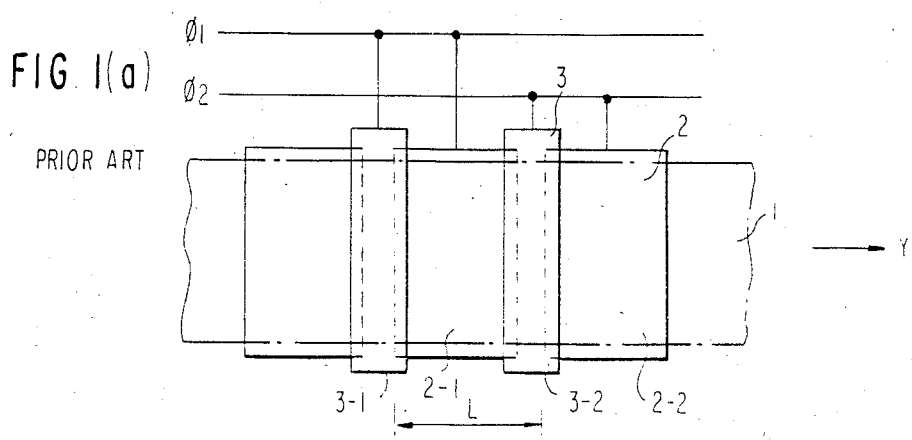
FIG. 1(a) PRIOR ART
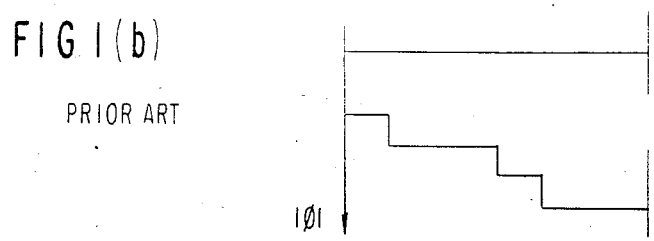
FIG. 1(b) PRIOR ART
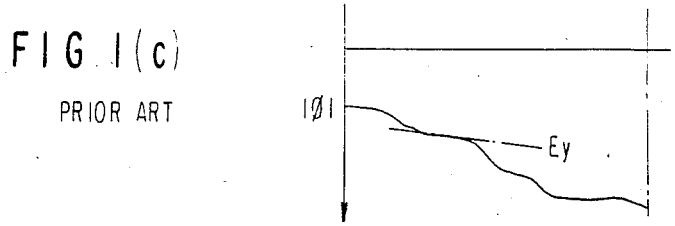
FIG. 1(c) PRIOR ART
FIG. 2
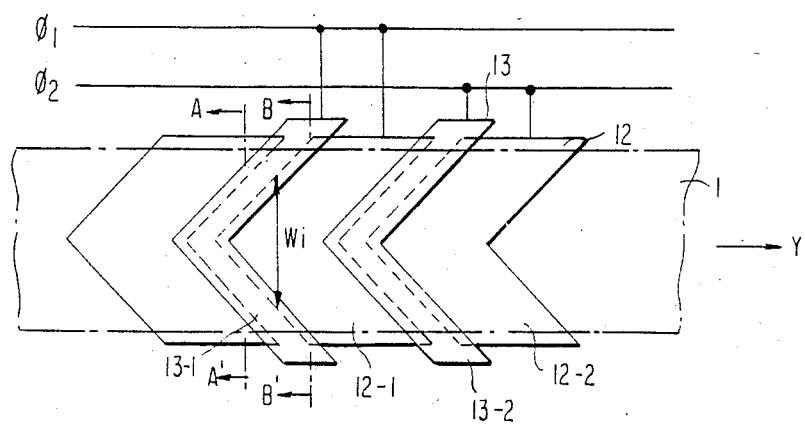

CHARGE TRANSFER DEVICE HAVING IMPROVED ELECTRODES

BACKGROUND OF THE INVENTION

1. Field of the Invention

The present invention relates to a charge transfer device and, more particularly, to an improved electrode construction for use in a charge transfer device.

2. Description of the Prior Art

Charge transfer device (CTD) represented by a charge coupled device (CCD) or a bucket-brigate device (BBD) are applied to a number of electrical devices such as memories, image pick-up devices or delay lines, due to their functions of charge storage and charge transfer. One of the important characteristics of the CTD used in the electrical devices is a charge transfer efficiency. This is because a charge transfer through a large number of transfer gates, for example several hundreds is required in recent applications. As a result, a tiny loss in a single transfer gate will produce a very large loss upon the final output. Therefore, there is a strong demand to improve the transfer efficiency of CTDs.

This transfer efficiency strongly depends not only on the waveform of the clock pulses, but also on both the strength of the electric field accelerating the transfer of the charges and the length of the respective gates. Especially, the influence of the accelerating electric field becomes dominant when the frequency of the clock pulses is high, in case of the same length of the gates.

A charge transfer device according to the prior art has a number of transfer electrodes formed on but isolated from a channel region which is a region of a semiconductor substrate for transferring charges. These transfer electrodes are arranged so as to intersect that channel at right angles. Stepped potentials are established in the channel region by clock pulses applied to these transfer electrodes so that charges are transferred by the potential differences between regions under the adjacent transfer electrodes. Those stepped potentials are not uniform under the respective transfer electrodes but is more or less inclined. This inclined potential distribution generates fringing fields which accelerate the charge transfer. As the fringing fields are made more intense by, for example, shortening the length of the transfer electrodes in the charge transfer directions, the charge transfer can be effected more completely. However, this shortening causes another drawback of a small transfer capacity of charges. In case of same lengths of the transfer electrodes, so long as the transfer electrodes have a band shape that intersects the transfer direction of the channel region at right angles, however, it is impossible to expect any significant intensification of the fringing fields. This means that any significant improvement of the charge transfer efficiency cannot be expected.

SUMMARY OF THE INVENTION

It is, therefore, a major object of the present invention to provide a charge transfer device which has an improved charge transfer efficiency.

Another object of the present invention is to provide a charge transfer device which has an intense electric field in the channel for accelerating the charge transfer.

According to the present invention, a charge transfer device is provided in which a number of transfer electrodes are arranged in a row on a semiconductor substrate along a charge transfer direction, the transfer electrodes being isolated from the semiconductor substrate through an insulating layer, and having a central part which is concaved in the direction opposite to the charge transfer direction.

According to a more limitative aspect of the present invention, a charge transfer device is provided in which a plurality of transfer electrodes are formed in a row on a semiconductor substrate along a charge transfer direction, the transfer electrodes being isolated from the semiconductor substrate through an insulating layer, and being formed into a chevron or arrowhead shape or an arcuate shape whose central part is moved away from both their edges in the direction opposite to the charge transfer direction.

Since the central parts of the transfer electrodes are concaved in the charge transfer direction in the present invention, the electric fields established in the semiconductor substrate by a clock pulse applied to the transfer electrodes has a deep potential well that diverges gradually in the charge transfer direction. Due to this diverging potential well, distribution of charges to be transferred from the potential well becomes more sharp than that in the prior art, to increase the accelerating electric fields. In other words, due to the diverging potential wells, additional fringing fields are applied to the charges to be transferred in addition to the conventional fringing fields. As a result, the accelerating electric fields applied to the charges are substantially intensified so that the transfer efficiency is improved. With these centripetal electric fields, moreover, a transferring path of the charges are curved toward the center as they are transferred. This is equivalent to an effective shortening of the length of the transfer electrodes in the charge transfer direction, which also improves the transfer efficiency.

BRIEF DESCRIPTION OF THE DRAWINGS

The above and further objects, features and advantages of the present invention will become more apparent from the following detailed description of the present invention taken in conjunction with the accompanying drawings, in which:

FIG. 1(a) is a plan view of a portion of a charge transfer device according to the prior art;

FIG. 1(b) is a potential distribution chart illustrating schematically the potential below the transfer electrodes of the charge transfer device of the prior art;

FIG. 1(c) is a potential distribution chart illustrating more accurately the potential below the transfer electrodes of the charge transfer device of the prior art;

FIG. 2 is a plan view of a portion of a charge transfer device according to a first embodiment of the present invention;

DESCRIPTION OF THE PREFERRED EMBODIMENTS

Figure 3:
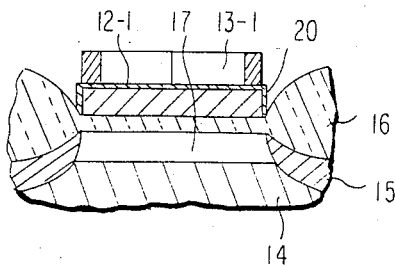
FIG. 3 is a section taken along the line B—B' of FIG. 2.

FIG. 1(a) is a plan view of the electrode portion of a two-phase CCD according to the prior art, with the driving clock pulses therefor. Above a channel region 1 on one principal surface of a P-type silicon substrate, a number of main electrodes 2 (2-1, 2-2, ...) for storing charges are arranged in a row over a thin gate oxide film, alternately with a number of auxiliary electrodes 3 (3-1, 3-2, ...) for determining the transfer direction of the charges over a thicker gate oxide film. Clock pulses $\phi_1$ and $\phi_2$ are applied to alternate pairs (i.e., 2-1 and 3-1, 2-2 and 3-2, ...) of these main and auxiliary electrodes 2 and 3. A P+-type region is formed in the surface region of the P-type substrate outside the channel region 1 to prevent the formation of stray channels below the wiring.

Assume that pulses with the relationship of $|\phi_1| < |\phi_2|$ are applied as clock pulses $\phi_1$ and $\phi_2$. The depth $|\phi|$ of the potential well formed develops a stepped shape in the charge transfer direction, as is illustrated schematically in FIG. 1(b), so that the charges are transferred. It should be noted that the potential distribution shown in FIG. 1(b) is only a simplified diagram for facilitating the explanation. In reality, however, the potential distribution inclines in the charge transfer direction Y by a distribution of charges to be transferred to produce fringing fields $E_y$ as is illustrated in FIG. 1(c). Due to these fringing fields $E_y$, charge transfer is accelerated to improve the charge transfer efficiency.

Incidentally, the charge transfer of a CCD is effected not only by the fringing fields $E_y$ but also by thermal diffusion and self-induction electric fields. Nevertheless, it is known in the art that the effect of the fringing fields $E_y$ mainly determine the transfer efficiency as the frequency of the clock pulses becomes higher. According to the prior art, however, the electrodes 2 and 3 are shaped into rectangles, as shown in FIG. 1(a), which makes it difficult to increase the fringing fields $E_y$ any further. If the gate length L is reduced, the fringing fields $E_y$ can be increased to some extent, but this would reduce the transfer capacity. This means that so long the rectangle transfer electrodes according to the prior art are used, it will be extremely difficult to improve the transfer efficiency, thus raising the problem that the current demand for an improvement in the transfer efficiency cannot be satisfied.

FIG. 2 is a plan view of the electrode portion of a two-phase CCD according to a first embodiment of the present invention, with the driving clock pulses therefor. The difference between this embodiment and the prior art example shown in FIG. 1 resides in that main electrodes 12 (12-1, 12-2, ...) and auxiliary electrodes 13 (13-1, 13-2, ...) are shaped as chevrons, i.e., the electrodes are chevron-shaped with their central portions being concaved in the charge transfer direction. The remaining construction is the same as that of the prior art example so that the reference numerals are left unchanged.

FIG. 3 is a partial, sectioned view of a section B—B' of the main electrode 12-1 of FIG. 2, at right angles to the transfer direction Y. Specifically, this CCD is constructed so that the main electrode 12-1 is positioned above the channel portion 1 of a P-type silicon substrate 14 via a silicon oxide film 16. A potential well is established in the channel portion 1 by applying clock pulses $\phi_1$ to the main electrode 12-1. The surface of the main electrode 12-1 is covered with a thin silicon oxide film 20, on top of which the auxiliary electrode 13-1 is slightly overlapped. The silicon oxide film 16 is thickened outside the channel portion 1. A P+-type region 15 is formed below the film 16 to prevent the formation of stray channels. Under the main electrode 12-1, a thin oxide film is formed on the channel portion 1. An oxide film (not shown in FIG. 3) having a thickness thicker than that under the main electrode 12-1 but thinner than the oxide film 16 is formed under the auxiliary electrode 13-1.

Figure 4:
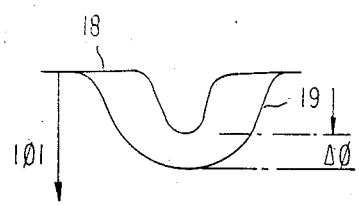
FIG. 4 is a potential distribution chart illustrating the potential below the transfer electrodes along sections A—A' and B—B'.

FIG. 4 illustrates the potential distribution in the channel portion 1 along the sections A—A' and B—B' of FIG. 2. The potential distribution curve 18 corresponds to the section A—A' whereas the potential distribution curve 19 corresponds to the section B—B'. More specifically, the main electrode 12-1 diverges from its center of the side opposite to the transfer direction Y (i.e., in the vicinity of section A—A') to section B—B' along the transfer direction, so that its width Wi increases in the transfer direction Y. Under the width increasing region of the main electrode 12-1, the enhanced fringing field $E_y$ (refer to FIG. 1(c)) is established in parallel to the transfer direction Y. As a result, straight potential distribution lines with a constant potential gradient determined by the fringing fields $E_y$ are juxtaposed such that they start along the outer sides (i.e., the two sides other than the base) of the triangle and extend with the larger displacements thereof in the transfer direction Y as they gradually come closer to the outer edges from their center portions. As a result, the potential distribution in the plane normal to the transfer direction Y is a composite of the fringing fields $E_y$ generated at each portion so that the potential $|\phi|$ decreases with distance from the center as is illustrated in FIG. 4. This results in the establishment of a new potential difference $\Delta\phi$ between the sections A—A' and B—B', in addition to the conventinal fringing field, both of which are applied to charges to be transferred as electric fields to accelerate the charges. According to the electrode construction of the present embodiment, therefore, a new acceleration field based upon the concaved electrode construction is applied in addition to the conventional fringing fields $E_y$ so that the transfer efficiency is improved accordingly. As is apparent from FIG. 4, more specifically, the potential $\Delta\phi$ has a higher level at the center to establish an electric field which is directed from the edges toward the center of the electrode. Due to this electric field, the charges transferred along side of the channel portion 1 are changed their transfer direction toward the center of the electrode. This implies that the gate length L of the electrode is effectively shortened so that the transfer efficiency is more improved thereby.

Figure 5:
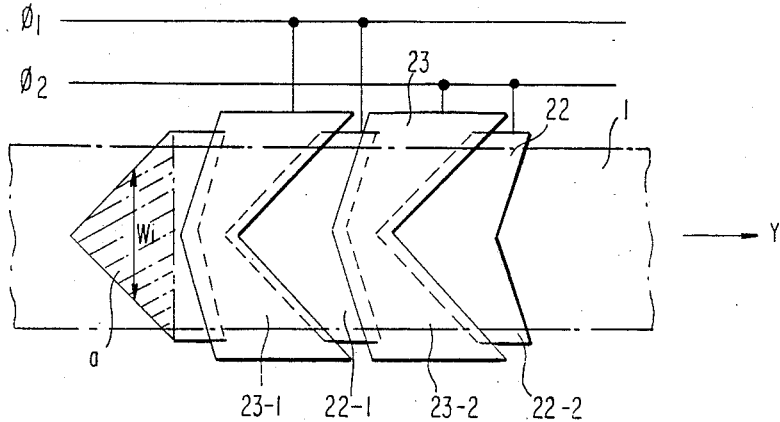
FIG. 5 is a plan view of a portion of the charge transfer device according to a second embodiment of the present invention.

FIG. 5 is a plan view of the electrode portion of a two-phase CCD according to a second embodiment of the present invention, with the driving clock pulses therefor. The differences between this embodiment and the first embodiment shown in FIG. 2 are that the main electrodes 22 (22-1, 22-2, ...) have a shallow concave in the side of the transfer direction Y and a deep concave in the side opposite to the transfer direction Y, and that the auxiliary electrodes 23 (23-1, 23-2, ...) have a deep concave in the side of the transfer direction Y and a shallow concave in the side opposite to the transfer direction Y. This construction is designed to increase the proportion of the area of the triangular portion (i.e., the portion a of the main electrode 22) of the main electrode, and is intended to increase the above effect of the accelerating electric field based upon the electrode construction thus far described. In this instance, incidentally, it is conceivable that the gate length may be increased to reduce the transfer efficiency at the edges of the auxiliary electrodes 23. However, the edge portions are far from the center of the cannel portion in which the charges flow. Therefore, this increased gate length does not effect to the transfer efficiency. On the contrary, the increment of the accelerating fields in the center portion contributes to the improvement of the charge transfer efficiency.

Figure 6:
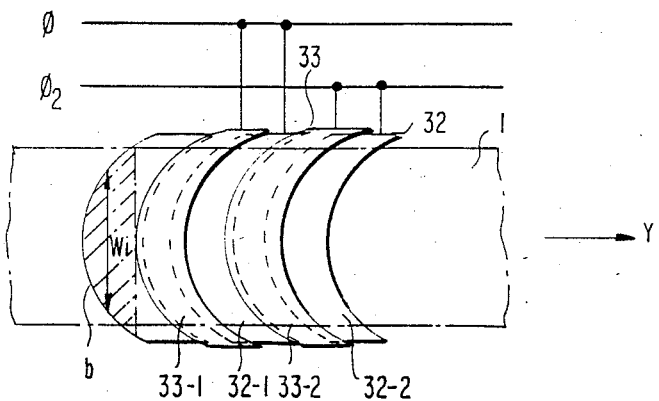
FIG. 6 is a plan view of a portion of the charge transfer device according to a third embodiment of the present invention.

FIG. 6 is a plan view of the electrode portion of a two-phase CCD according to a third embodiment of the present invention, with the driving pulses therefor. The difference between this embodiment and the previous embodiments is that main electrodes 32 (32-, 32-2, ...) and auxiliary electrodes 33 (33-1, 33-2, ...) are formed that their sides in the transfer direction are arcuate. Although diameters of both arcuates of the respective electrodes are same in this case, it may be possible to make it of the arcuates in the charge transfer direction Y larger than the other. Referring back to FIG. 3, the proportion of each of the main electrodes 32 which is occupied by the portion where the width Wi increases in the transfer direction Y (i.e., the portions b of the main electrodes 32), is increased compared to the above-mentioned embodiments. Therefore, it becomes possible to remove the problem of the second embodiment that the gate lengths at the edges of the auxiliary electrodes 33 are increased. As a result, the transfer efficiency can be improved easily with this third embodiment.

Although the present invention has been described in detail in connected with several embodiments, its application should not be limited to those embodiments, a variety of modifications can be conceived. In short, it is sufficient that the electrodes are shaped so that the dimensions thereof perpendicular to the charge transfer direction are partially increased in the transfer direction, and that the two opposite sides in the transfer direction are each indented in the transfer direction.

Although the electrodes in the above embodiments are shaped symmetrically about the center line of the channel portion, moreover, they may be assymetrical if required case may be.

Incidentally, although the description thus far is directed mainly toward a two-phase CCD, the present invention may be similarly applied to other types of CCD, and BBDs.

As has been described in detail hereinbefore, thanks to the use of electrodes having the above new shapes, an accelerating electric field based upon the electrode construction can be newly applied to the existing fringing fields, and charges can be transferred along the center line of the electrodes, along which the gate length is effectively shortened. As a result, the charge transfer device according to the present invention can enjoy the effect that the transfer efficiency thereof is improved markedly.

What is claimed is:

1. A charge transfer device comprising a semiconductor region of one conductivity type, said semiconductor region having a straight striped shape with two parallel long sides and forming a channel region through which charges are transferred, an insulating layer formed on said semiconductor region and a plurality of electrodes formed on said insulating layer so as to form a row of electrodes along a charge transfer direction, said electrodes being supplied with clock pulses to generate a potential distribution in said semiconductor region for transferring charges and having first and second sides in said charge transfer direction and third and fourth sides parallel to the parallel long sides of said stripe shaped semiconductor region, said first and second sides having such a shape in plan view that the central portions thereof and more indented than the other portions thereof in said charge transfer direction.

2. A charge transfer device as claimed in claim 1, wherein the same clock pulses are applied to alternate pairs of adjacent electrodes of said plurality of electrodes and different clock pulses are applied to other pairs of adjacent electrodes.

3. A charge transfer device as claimed in claim 1, wherein said first and second sides are respectively formed of straight lines from said central portion to said third and fourth sides.

4. A charge transfer device as claimed in claim 3, wherein said charges are transferred from said first side to said second side, the angle formed with said straight lines in said second side being larger than the angle formed with said straight lines in said first side.

5. A charge transfer device as claimed in claim 1, wherein said first and second sides have such arcs that the centers of curvature thereof are located in said charge transfer direction.

6. A charge transfer device comprising a semiconductor region of one conductivity type, an insulating layer formed on said semiconductor region, and a plurality of electrodes formed in a row on said insulating layer, said electrodes receiving clock pulses producing potential wells in said semiconductor region to transfer charges along said row, each of said electrodes having two sides intersecting said row, said sides being respectively formed of two side lines which intersect in a manner that diverges in a charge transfer direction, and said two side lines forming the side facing said charge transfer direction intersecting at a larger angle than that at which the two side lines of the side facing the direction opposite to said charge transfer direction intersect.

* * * * *

UNITED STATES PATENT AND TRADEMARK OFFICE
CERTIFICATE OF CORRECTION

PATENT NO. : 4,589,005
DATED : May 13, 1986
INVENTOR(S) : H. MATSUDA et al

It is certified that error appears in the above-identified patent and that said Letters Patent is hereby corrected as shown below:

Column 4, Line 39  "in addition to the conventinal fringing"

should read

--in addition to the conventional fringing--

Column 6, Line 22  "thereof and more indented"

should read

--thereof are more indented--

Signed and Sealed this

Twenty-fifth Day of November, 1986

*Attest:*

DONALD J. QUIGG

*Attesting Officer*          *Commissioner of Patents and Trademarks*